US 6,566,882 B2

(12) United States Patent
Baldwin et al.

(10) Patent No.: US 6,566,882 B2
(45) Date of Patent: May 20, 2003

(54) METHOD AND APPARATUS FOR DEVICE-DEPENDENT CALIBRATION OF RELAYS FOR HIGH ACCURACY OPERATION AT ZERO-CROSSING OF INPUT POWER SIGNAL

(75) Inventors: John R. Baldwin, Newtown, CT (US); Thomas James Batko, Wallingford, CT (US); Daming Yu, Easton, CT (US)

(73) Assignee: Hubbell Incorporated, Orange, CT (US)

( * ) Notice: Subject to any disclaimer, the term of this patent is extended or adjusted under 35 U.S.C. 154(b) by 17 days.

(21) Appl. No.: 09/894,826

(22) Filed: Jun. 29, 2001

(65) Prior Publication Data

US 2003/0001577 A1 Jan. 2, 2003

(51) Int. Cl.[7] .............................................. G01R 31/327
(52) U.S. Cl. ....................................... 324/418; 361/160
(58) Field of Search ................................. 324/418, 423, 324/424; 361/160, 168.1, 170–171, 195–196; 307/127, 130, 141

(56) References Cited

U.S. PATENT DOCUMENTS

| | | | |
|---|---|---|---|
| 3,340,465 A | 9/1967 | Clark | 324/28 |
| 4,724,391 A | 2/1988 | Blahous | 324/424 |
| 5,065,101 A | 11/1991 | Ledbetter | 324/418 |
| 5,134,375 A | 7/1992 | Fuchi | 324/419 |
| 5,530,615 A | 6/1996 | Miller et al. | 361/160 |
| 5,644,463 A | * 7/1997 | El-Sharkawi et al. | 361/94 |
| 5,821,642 A | 10/1998 | Nishhira et al. | 307/127 |
| 6,084,394 A | 7/2000 | Windsheimer et al. | 324/130 |
| 6,151,529 A | * 11/2000 | Batko | 700/28 |

* cited by examiner

Primary Examiner—Christine Oda
Assistant Examiner—Amy He
(74) Attorney, Agent, or Firm—Stacey J. Longanecker; Alfred N. Goodman; Mark S. Bicks

(57) ABSTRACT

A system and method are provided for ensuring increased accuracy of individual relays (e.g., within a control system including a sensor) to close substantially coincidentally with respect to a current zero-crossing of an incoming power supply waveform. To determine timing of contact operation, a microcontroller operates the contacts in response to one of a series of test pulses, and determines the amount of time required for contact operation. The difference between timing of contact operation and zero-crossing is determined and adjusted to offset errors incurred by microcontroller threshold variations and power supply voltage variations. The calibrated value is then provided to the sensor in order to extend sensor life.

25 Claims, 7 Drawing Sheets

US 6,566,882 B2

METHOD AND APPARATUS FOR DEVICE-DEPENDENT CALIBRATION OF RELAYS FOR HIGH ACCURACY OPERATION AT ZERO-CROSSING OF INPUT POWER SIGNAL

FIELD OF THE INVENTION

The present invention relates generally to a system and method for calibrating contact operation time of a relay that is substantially coincident with a current zero-crossing of an input power signal. More particularly, the present invention relates to calibrating the contact closure times of each of a number of individual relays, and storing the calibration factor of a selected relay within the microprocessor of a sensor which employs the selected relay, to ensure contact closure at substantially the current zero-crossing of the input power supply.

BACKGROUND OF THE INVENTION

Many commercial, industrial, and government facilities requite a significant number of lighting fixtures for adequate illumination, and therefore use a significant amount of power to operate the fixtures. To reduce the power consumed to light these facilities, a number of lighting control systems are used which employ sensors to automatically and selectively power the light fixtures on and off.

The sensors generally employ relays in order to control the supply of power to the light fixture, depending on room occupancy and time of day, among other factors. The sensor life can be greatly extended if the relay contacts close at substantially a current zero-crossing of the input power signal.

In order to facilitate the coincidental timing of the contact closure with zero-crossing, various errors need to be calibrated. These errors can include, for example, a relay-dependent variation in time between initiating contact closure and actual contact closure, depending on variation in power supply voltage from a nominal power supply. In other words, there are unit-to-unit variations among multiple relays with respect to the time that elapses between the input signal energizing a relay drive circuit and actual contact closure. Relay energization time variations can be as much as ±0.42 milliseconds (msec.) with a nominal supply voltage of 13.9 VDC. Additionally, an error of as much as ±0.48 msec. results from the power supply variation. For example, the range for power supply variations is from 12.6 VDC to 15.1 VDC, nominal and non-nominal, respectively. An additional error (e.g., as much as ±0.24 msec.) results from microcontroller threshold changes due to microcontroller activation time variations. The above-mentioned errors (e.g., microcontroller threshold variation errors, relay energization time errors, and power supply voltage variation) are cumulative and fixed for a single sensor. The calibration of all three of these errors would greatly increase the life of the relay, and therefore the sensor. Thus, a need exists for a method of calibrating the relay contact closure point on a per-relay basis such that contact closure is substantially coincidental with a current zero-crossing of an input power signal regardless of microcontroller threshold variation errors, relay energization time errors, and power supply voltage variation.

As mentioned above, the combinations of various power supplies, microprocessors or microcontrollers and associated relays present unique errors. Accordingly, conventional methods of calibrating multiple relays (e.g., an entire lot of relays during their manufacture) with the offset timing error from one relay does not compensate for the error contributed by each relay which, as discussed above, can vary greatly and therefore shorten the sensor life.

SUMMARY OF THE INVENTION

The present invention overcomes the deficiencies of existing relays within control systems and realizes a number of advantages over conventional relay-operated control systems. A system is provided in accordance with the present invention that calibrates offset error for individual relays and stores the offset error of a particular relay in, for example, the microcontroller of a sensor within a control system (e.g. in a lighting control system) to facilitate contact operation at substantially the current zero-crossing of an input power signal. A method is provided for deploying a plurality of relays in respective control systems (e.g., sensors for light fixtures) which comprises testing contacts of respective relays, storing the corresponding calibrated contact operation times in a memory device, and transferring each of the offset times to a processing device such as the memory (e.g., EEPROM) provided within a microcontroller for the respective control device in which the corresponding relay is deployed.

The present invention also provides a method for determining timing of contact operation of a relay. The method comprises generating a relay test request signal, for example, a plurality of pulses occurring in a pre-determined pattern (e.g., at substantially the current zero-crossing), initiating operation of the contacts of the relay in response to one of the pulses, and determining the amount of time required for contact operation in response to the pulse (e.g., the time difference between zero-cross and contact closure). The method comprises determining whether the amount of time for the relay to operate is greater than the time between the pulses, and storing the amount of time for the relay to operate in a memory device if the amount of time for the relay to operate is less than the time between pulses. A microcontroller or other processing device can be programmed to employ the time difference as a calibration factor to be added to or subtracted from the time when a non-calibrated relay control signal initiates the contacts. The calibration factor can also take into account variations associated with the power supply and the processing device (e.g., processing time corresponding to relay control operations).

The present invention also provides an apparatus for testing contact operation of a relay within a control system. The apparatus comprises a memory device and a processing device, such as a microcontroller containing an EEPROM, operable to store an amount of time corresponding to the time needed to enable the relay contacts to operate, as well as an interface circuit between the control system and the processing device. During relay production, the control system is coupled to the apparatus via the interface circuit.

In accordance with an aspect of the present invention, the control system employs a microcontroller with a calibrated value of the contact operation time corresponding to the particular relay, power supply, and the microcontroller, which is employed by a relay-operated sensor within the control system.

In accordance with another aspect of the present invention, the calibrated value of the contact operation time corresponds to the offset timing of contact operation compared to the zero-crossing of the incoming power signal.

In accordance with yet another aspect of the invention, the offset of contact operation time compared to a zero-crossing is measured several times, and the average value is then provided into the microcontroller or other processing device of the control system.

BRIEF DESCRIPTION OF THE DRAWINGS

These and other aspects, advantages and novel features of the invention will be more readily appreciated from the following detailed description when read in conjunction with the accompanying drawings, in which.

DETAILED DESCRIPTION OF THE PREFERRED EMBODIMENT

Figure 1:
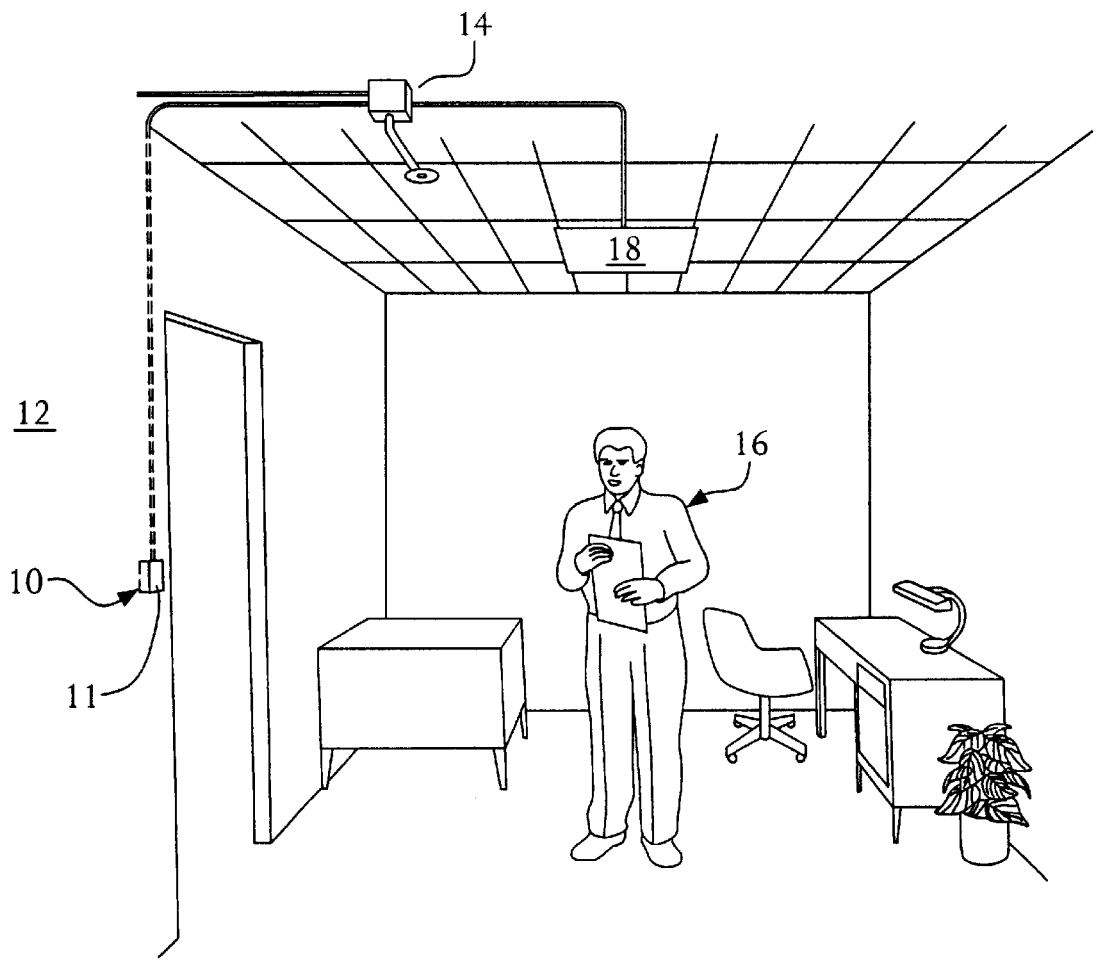
FIG. 1 is an overall view of a lighting control system mounted on a wall for controlling suspended lighting fixtures, and constructed in accordance with an embodiment of the present invention.

An exemplary control system 10 for use in conjunction with the present invention is depicted in FIG. 1. The control system 10 can be used with a number of different loads such as HVAC, security, and temperature control systems. The control system 10 in the illustrated embodiment is implemented, for example, with lighting fixtures for illustrative purposes. The control system 10 is secured to a wall 12 at a height selected to enable the sensor 11 within the control system 10 to detect when an occupant 16 is walking in proximity of the sensor 11. As will be described below, the control system 10 facilitates the automatic powering up and down of lighting fixtures 14 which are typically mounted overhead to a ceiling 18.

Figure 2:
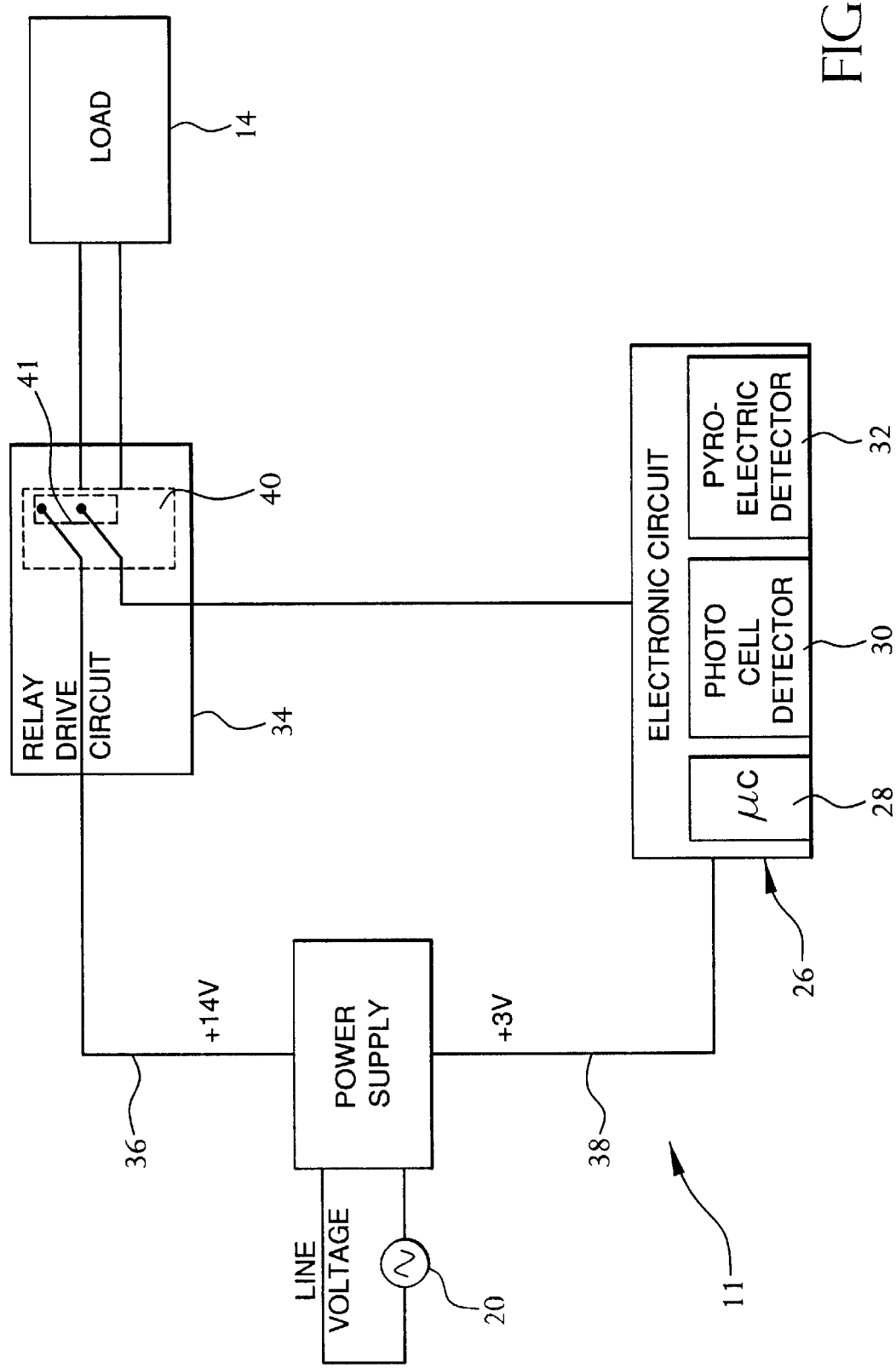
FIG. 2 is a block diagram illustrating an exemplary sensor comprising a relay to be tested and calibrated in accordance with an embodiment of the present invention.

FIG. 2 is a block diagram of the sensor 11 of the control system 10 of FIG. 1. A power source 20 provides varying voltages to a relay drive circuit 34 and an electronic circuit 26, for operation of a load 14. The load 14, for example, is a light fixture, a security system, or a thermostat, as mentioned above. The electronic circuit 26 preferably comprises a microcontroller 28, a photocell 30, and a pyro-electric detector 32. The photocell 30 provides the sensor 11 with light sensitivity operations, whereas pyro-electric detector 32 provides information regarding room occupancy (e.g., motion sensing) in a conventional manner. The microcontroller 28 facilitates closing the contacts 41 of the relay drive circuit 34 substantially coincidentally with the zero-crossing of an input power signal. In accordance with the present invention, a processing device, such as a microprocessor 70 in FIG. 3, measures offset timing for contact closure to be substantially coincident with a zero-crossing for individual relays (e.g., relay 40) and provides this calibrated value to the EEPROM of the microcontroller 28, for example. Accordingly, the relay drive circuit 34 closes the contacts 41 upon signaling from the microcontroller 28 which employs the calibrated contact closure time. The calibrated value accounts for such factors as processor reaction time to implement the calibrated value, an individual relay reaction or contact closure time, and power supply voltage variations, among other factors.

In addition, the sensing circuit 11 preferably has a total field of view of approximately 170 degrees, and an adjustable coverage depth between 13 and 32 feet for an occupant working in a 280 to 800 square foot area. The presence of an occupant can be detected using a number of different techniques such as measuring changes in the amount of energy measured by a detector, detecting the breaking of an optical beam or a temperature differential. Accordingly, in operation, when the photo-cell and pyroelectric detectors 30 and 32, respectively, measure a change in the amount of energy in the room, the microcontroller 28 determines if the amount of change is sufficient to enable or disable the load 14. If the amount of change is sufficient, the microcontroller 28 initiates the contacts 41 of a relay 40 to either close or open, depending upon the occupancy of the room. The microcontroller 28 enables the contacts 41 according to the calibrated contact closure time stored in the EEPROM of microcontroller 28. This calibration time has been determined in accordance with the present invention for the particular relay 40, power supply 20, and microcontroller 28 employed within the sensor 11 such as during manufacture of the relay 40.

In accordance with one embodiment of the present invention, the electronic circuit 26 uses the photo-cell detector 30 and the pyro-electric detector 32 for adaptive timing. Alternatively, the sensor 11 can be provided with a potentiometer as a fixed timing mechanism. The fixed timing embodiment generally requires the use of a screwdriver or other tool to manually adjust ambient light settings, for example. In addition, this type of control system generally requires calibration of the light sensing device during factory testing. This is in contrast to the adaptive timing mechanism, as depicted in FIG. 2, which monitors a number of functions (e.g., usage pattern of room, and daylight hours) and automatically adjusts the delay time for powering on or off the associated load 14 accordingly.

Figure 3:
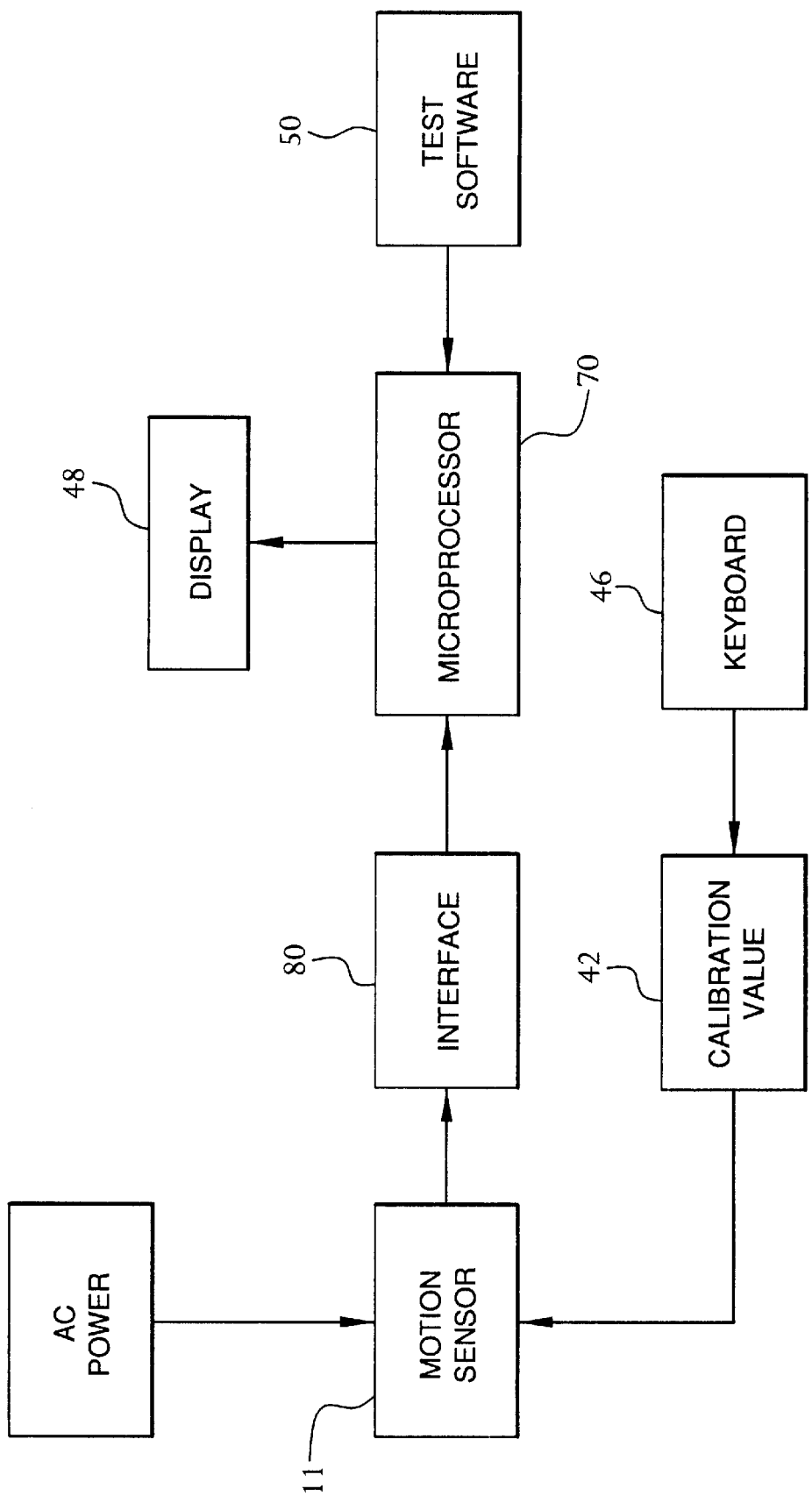
FIG. 3 is a block diagram depicting an apparatus for testing contact operation of a relay in accordance with an embodiment of the present invention.
Figure 5:
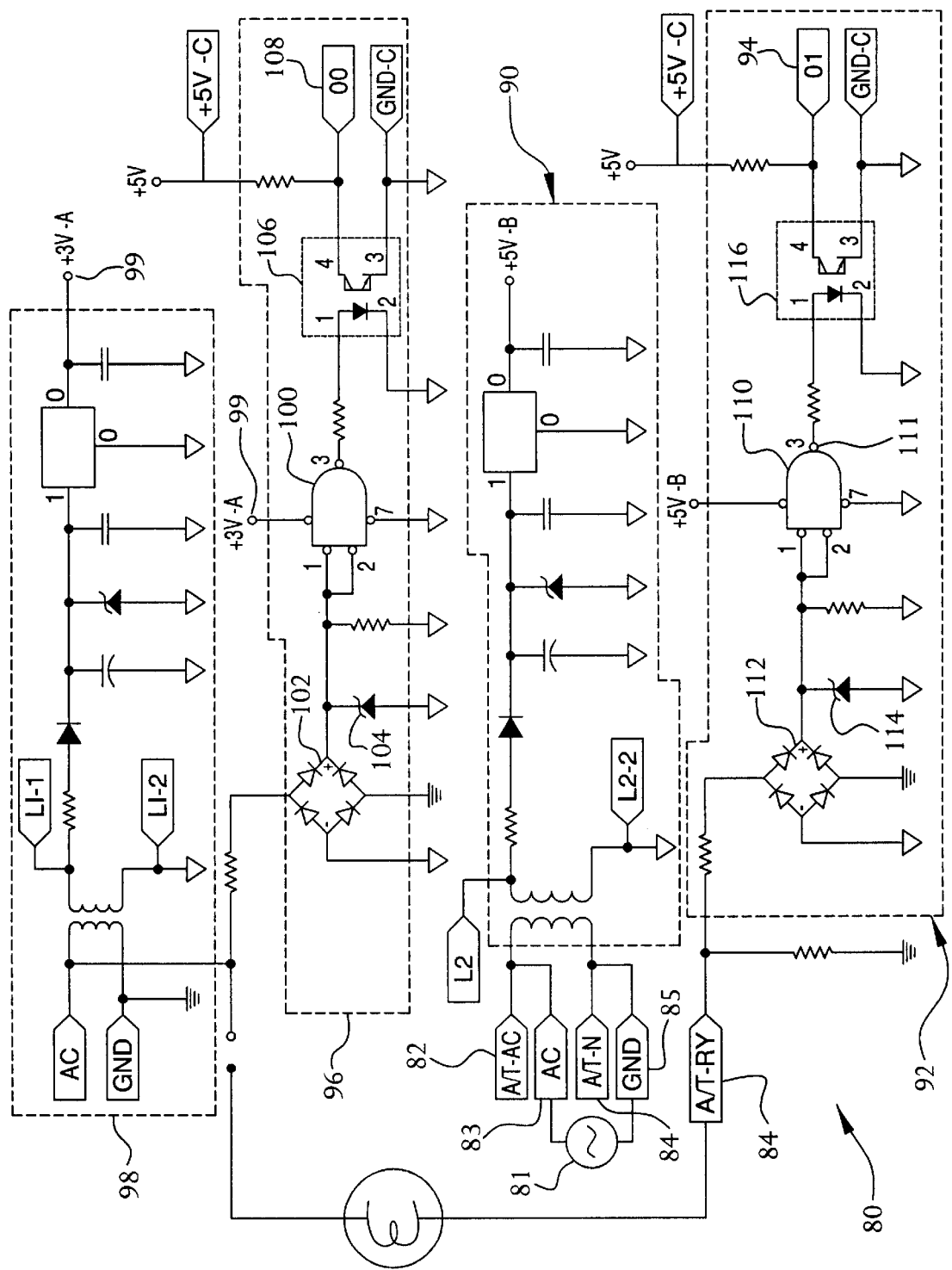
FIG. 5 is a detailed schematic of an interface circuit between a relay being calibrated and an apparatus for measuring the offset error of relay contacts constructed in accordance with an embodiment of the present invention.

The system employed in accordance with the present invention to program the microcontroller 28 of the electronic circuit 26 is depicted in FIG. 3. For exemplary purposes, the sensor 11 employing an adaptive timing mechanism is shown; however, a sensor employing a potentiometer can be used. The sensor 11 comprising relay 40 is coupled to a microprocessor 70 via an interface circuit 80 that comprises a zero-cross detection circuit and is depicted in FIG. 5. Accordingly, the microprocessor 70 is provided with test software 50 that determines the offset time between the current zero-crossing of the input power supply and the operation of the relay 40. This calibration value 42 is shown on display 48 and then programmed into, for example, the EEPROM, of microcontroller 28 via a keyboard 46. This calibration value 42 is unique for each relay and can vary from as little as ±0.42 msec. to as much as ±0.48 msec., depending upon the relay. The calibration value 42 can also vary for each associated microcontroller and power supply. For example, the microcontroller 28 threshold time variation for a nominal power supply of 0.94 V at 120 V Line is preferably ±0.24 msec. Power supplies that are nominal have an average expected voltage, while non-nominal power supplies have a greater or less than expected voltage. Thus, depending upon the voltage of the power supply 20 and the microcontroller 28, the relay 40 can have varying operational times. As stated above, the ability to calibrate the relay 40 such that the contact operation time substantially coincides with zero-crossing thereby extends contact life.

Figure 4:
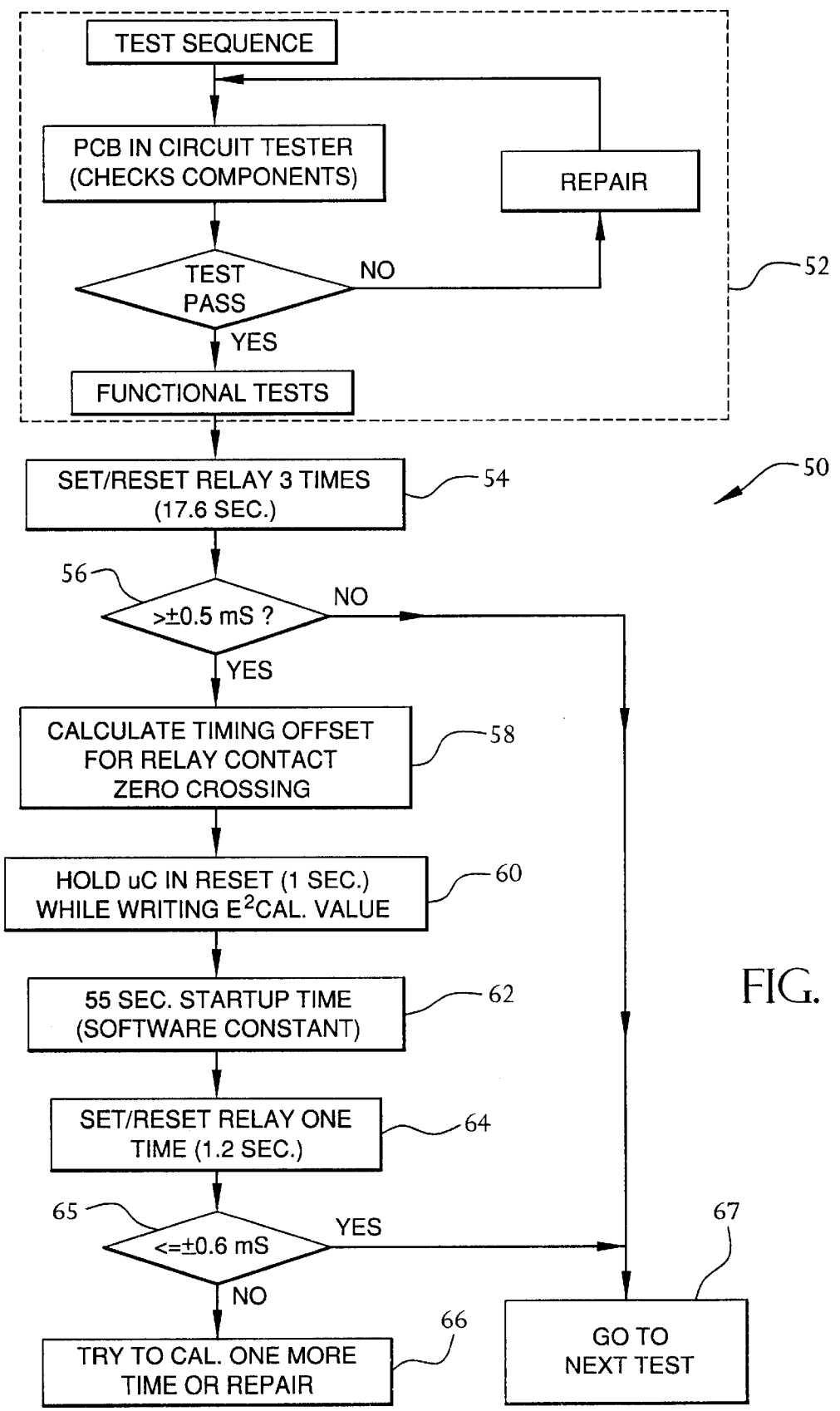
FIG. 4 is a flow chart depicting a sequence of operations for calibrating contact closure time in accordance with an embodiment of the present invention.

The test software 50 of FIG. 3 will now be described with reference to the flow chart in FIG. 4. The dotted line box 52 depicts functional testing of the various components of the sensor such as electronic circuit 26, the power supply 20, and the relay drive circuit 34. Upon completion of the functional testing of these various components, the microprocessor 70 begins calibration of the sensor 11. With reference to block 54 of FIG. 4, the relay is set and reset a number of times (e.g., three times) to ensure a reliable reading of the contact operation times. As will be described below, each relay is tested multiple times, and the response times therefor are averaged, before entering a calibration offset value into a microprocessor such as the microprocessor 28. Setting and resetting the relays can be accomplished, for example, via a pogo pin input or a front press switch input to the microcontroller 28.

The microcontroller 28 monitors the zero-crossing of the input power signal to begin the calibration process. In production, factory personnel depress a front press switch which is provided as an input to the microcontroller 28, resulting in a similar input to test the relay 40. Once the sensor 11 is deployed in a control system 10, however, the microcontroller 28 is programmed to generate its own test. Upon commencement of a calibration cycle, the microcontroller 28 commences generating a pre-determined sequence of pulses. For example, the microcontroller 28 can generate pulses of 0.2 seconds in duration which occur every 0.6 seconds. The microprocessor 70, as explained below in connection with FIG. 6, measures certain events with respect to these pulses to obtain a calibration value 42. The reaction time for the microcontroller 28 can be 0.1 msec. This reaction time is variable between relays, and is among the factors to be calibrated out by the microcontroller 28 in accordance with the present invention. Thus, the time between pulses is effectively, 0.5 msec., for example, and the contact operation time is greater than or equal to 0.5 msec., the contact 41 is calibrated to eliminate the offset error in order for the contact operation to be substantially coincidental with a zero-crossing (block 56), as described below in connection with FIG. 5. If the contact operation timing is less than 0.5 msec., then the microprocessor 70 that is testing the contact operation performs no calibration, and testing proceeds with the next relay. With reference to block 58, calculation of the timing offset for the contacts 41 to be substantially coincident with zero-crossing is performed as described in connection with FIG. 5 below. The microprocessor 70 is held in reset mode while factory personnel program the EEPROM of microcontroller 28 with the calibration value 42 obtained during testing, as shown in block 60.

With reference to block 62, a 55 second wait time is preferably provided for re-testing of the contacts 41 because resetting microprocessor 70 requires restarting the software 50 to ensure contact closure is coincident with the zero-crossing. Also, the 55 second wait time is software-controlled by microprocessor 70 to allow warm up of analog circuitry of sensor 11 when power is initially applied. With reference to block 64 of FIG. 4, another pair of relay pulses are generated for one cycle of 1.2 seconds, for example. This second check of the same relay 40 ensures an accurate calibration reading. With reference to block 65, the timing of contact 41 operation and the current zero-crossing are compared to ensure that the two events are within one pulse cycle or 0.5 msec. of one another. If the calibration time is within 0.5 msec., microprocessor 70 tests another relay (block 67). If the calibration time is greater than 0.5 msec. (block 66), then another attempt at re-calibration is made or testing of the functional components of the sensor 11 is performed to ensure the integrity of the sensor 11.

FIG. 5 is a schematic diagram of the interface unit 80 of FIG. 3 which couples the sensor 11 comprising relay 40 to the microprocessor 70 in order to calibrate any offset error from the contact activation time to the zero-crossing of the input power signal. In operation, the microprocessor 70 coordinates the relay 40 activation time with the detected zero-crossing times of the 60 Hz AC power supply 20 of the sensor 11 and accounts for delays associated with a number of devices, as mentioned above. For example, the relay 34 requires approximately 0.48 milliseconds, as described above, to initiate in response to a command by the microcontroller 28 due to detection of light or movement by sensor 11. Once a current zero-crossing is detected by means of the current zero-crossing detection circuit 96 shown in FIG. 5, the microprocessor 70 adds or subtracts the delay associated with the relay 40 from the next zero-crossing (which occurs, for example, at 8 and 16 milliseconds within a full cycle of a 60 Hz signal) to ensure that the contact opens at a substantially zero current level point in the power supply waveform. As stated above, operating the relay 40 substantially coincidentally with a zero-crossing of the power supply 20 increases contact life.

The microprocessor 70 is coupled to the interface 80 via output 94. The interface circuit 80 in FIG. 5 comprises four circuit components (90,92,96,98) which facilitate timing of current zero-crossing and activation of the relays of the sensor 11. The first circuit component 98 is a power supply circuit that preferably provides +5 V to the NAND gate 100 of circuit component 96. Circuit component 90 is also a power supply circuit preferably providing +5 V to the NAND gate 110 of circuit component 92. Circuit component 96 is a current zero-cross detection circuit for the power supply 20 of the sensor 11. Circuit component 92 is a contact operation detection circuit. The output of circuit components 92 and 96 are compared to determine the offset timing between contact 40 operation and a current zero-crossing.

To facilitate a physical connection between the sensor 11 and the interface circuit 80, three wires (i.e., a positive, negative, and neutral wires) are preferably provided. The positive lead (e.g., a black wire) is coupled to the input 82 of the third circuit component 90 of the interface 80. The negative lead (e.g. a red wire) is coupled to the input 84 of the fourth circuit component 92 of the interface 80. The neutral lead (e.g., a green wire) is coupled to input 84, but in another embodiment of the present invention, can also be coupled to the ground input 85.

The first circuit component 98 of the interface circuit 80 provides +5 V to the first NAND gate 100 of the second circuit component 96 of the interface circuit 80 via output 99. The second circuit component 96 of the interface circuit 80 provides the microprocessor 70 with the timing information relating to current zero-crossing to facilitate calibrating contact activation. Thus, as the input power supply waveform passes through a zero-crossing point, the output of circuit component 96 outputs a negative pulse. The negative pulses are generated via a bridge full-wave rectifier 102, a zener diode 104, the NAND gate 100, and an optocoupler 106. The bridge full-wave rectifier 102 rectifies the input power signal. The bridge 102 is preferably employed as a positive rectifier. The output signal from the bridge 102 is then clipped at the zener diode 104 at its breakdown voltage of +6.2 V. The output signal from the zener diode 104 is then inverted by the NAND gate 100 and provided to the optocoupler 106, which generates a series of negative pulses each time the incoming current passes a zero-crossing point. The optocoupler 106 provides an electrically isolated signal coupled between a photo-transistor and an LED. The LED emits light when current passes through the phototransistor which generates a signal upon receiving light from the LED. The phototransistor emits an inverted signal as the output of optocoupler 106. Accordingly, these negative or inverted pulses are transmitted to the microprocessor 70 via output 108.

The third circuit component 90 of the interface 80 supplies power to the NAND gate 110 of the fourth circuit component 92. The microprocessor 70 evaluates preferably two conditions in accordance with the present invention. The first condition is whether the incoming signal is essentially away from a zero-crossing point, and the second condition is whether the incoming signal is essentially at a zero-crossing point. If the incoming signal is not at a zero-crossing, then a positive signal is input to bridge full-wave rectifier 112. The bridge 112 rectifies the signal, which is then provided to the zener diode 114 having an associated breakdown voltage of 6.2 V. The signal is then clipped at 6.2 V, as can be appreciated by one skilled in the art. The NAND gate 110, powered by the third circuit component 90 of the interface circuit 80 as mentioned above, inverts the signal to cause the output 111 of NAND gate 110 to be low. The optocoupler 116 then converts the signal to a high state, thereby maintaining the output 94 of the fourth circuit component 92 in a high state. This signal is then transmitted to the microprocessor 70 to determine the time difference between the high state on output 94, and the low state on output 108 due to the negative pulses, as mentioned above.

If the incoming current is at the zero-crossing point and the contacts are closed, (e.g., zero incoming current), the input to the NAND gate 110 is low, in contrast to high input to the NAND gate 110 when the incoming power signal is away from a zero-crossing. The low signal at the NAND gate 110 is inverted and is therefore high at the output on NAND gate 110. The inverted signal is transmitted to the optocoupler 116 which again inverts the signal to low. Accordingly, the input to NAND gate 110 is high if the contacts operate away from a zero-crossing, and the input is low if the contacts operate at a zero-crossing. Therefore, the output 94 is high when the contacts operate away from the zero-cross and low when the contacts operate at a zero-crossing. Accordingly, the microprocessor 70 can distinguish between the incoming current being at or away from a zero-crossing, and adjust the required offset timing.

It is to be understood that an embodiment of the present invention can be implemented as shown in connection with FIG. 2. In addition, another embodiment of the present invention can employ semiconductor components, as opposed to mechanical or electromechanical relays. For example, a switching-type of semiconductor is preferably used such as a triac or SCR component. A gating signal is provided that controls the rectification in the interface circuit 80 in a conventional manner. For example, the gating signal operates similar to the relay drive circuit 34 in that, once the component is turned on via the gate signal, it remains on even after removal of the initial current upon condition of a minimal current maintained in the rectifying circuit, as can be appreciated by one skilled in the art. However, a lighting system employing a relay is preferable, as embodied in the present invention, due to the fact that a relay dissipates less power than a semiconductor device. Accordingly, a sensor employing semiconductor devices employs additional components to dissipate the excess heat generated by the devices.

Figure 6:
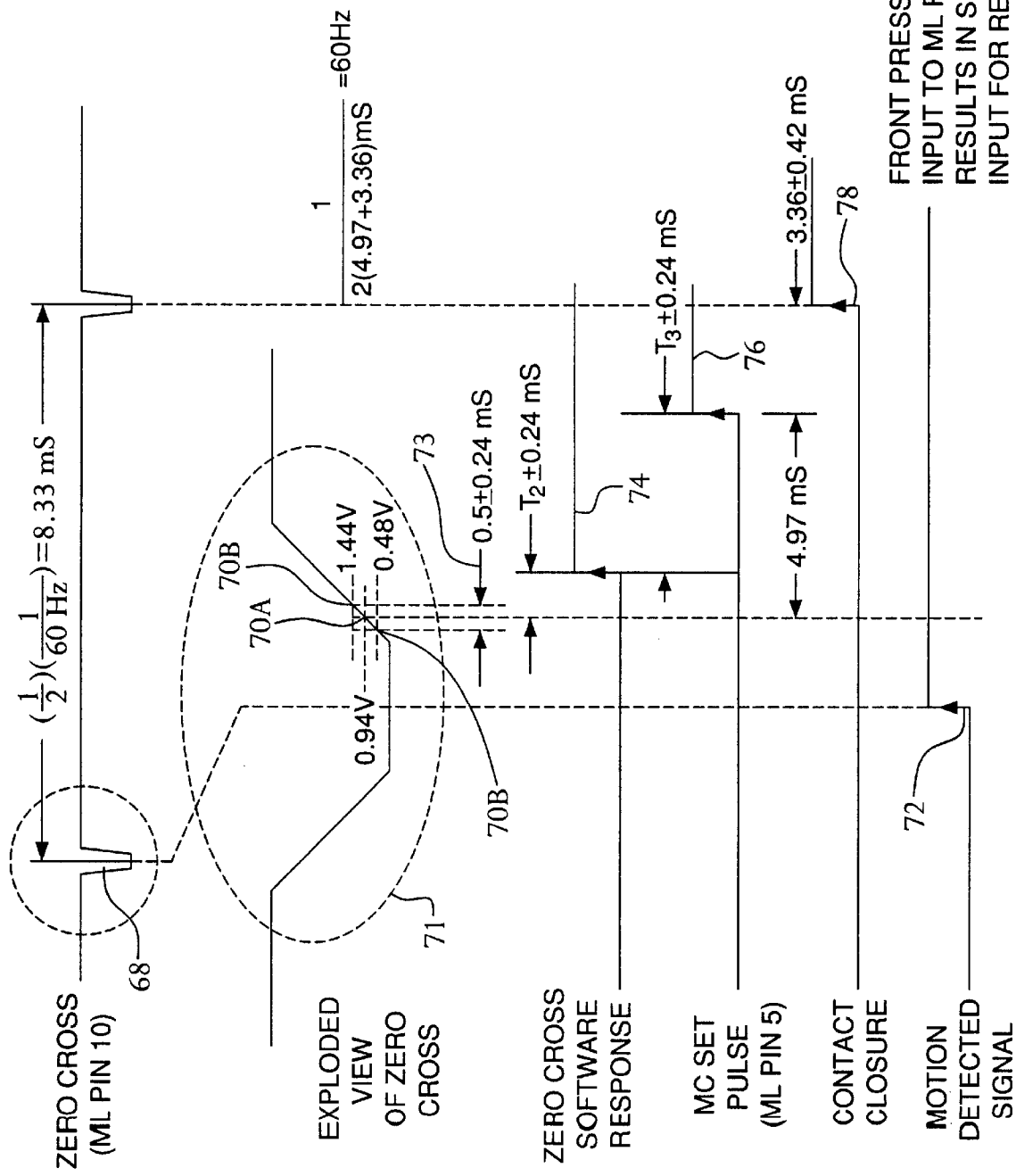
FIG. 6 is a timing diagram illustrating the elapsed time between current zero-crossings employed to measure contact timing error, reaction time of a microprocessor, and a relay activation time in accordance with an embodiment of the present invention.

FIG. 6 is a timing diagram illustrating the signal timing to operate contacts 40 in response to sensor 11. Microcontroller 28 monitors the current zero-crossing 68 which occurs every half-cycle of an AC sinusoid, or 8.33 ms. The exploded view 71 of current zero-crossing 68 details at 70A and 70B the current zero-cross level for a microcontroller (e.g., microcontroller 28) employing a nominal and non-nominal power supply, respectively, as mentioned above. Points 70A and 70B illustrate the variation in timing of current zero-crossing for individual relays employing nominal and non-nominal components and are provided to microcontroller 28 via tests from microprocessor 70.

A waveform 72 indicates the sensor 11 has detected either motion or light, thereby initiating the contacts 40 to enable load 14. Waveform 74 represents the current zero-cross error incurred by the power supply 20, as measured by microprocessor 70, in addition to the time delay caused by the software in microcontroller 28 to recognize the hardware input by the sensor 11. Waveform 76 represents the time required for the microcontroller 28 to initiate the relay drive circuit 34 to close contacts 41. In other words, the software requires an activation time to close the contacts 41 at the current zero-crossing. The software adjusts time T3 to account for the activation time, and generates a set pulse, with the cumulative offset error, to activate the circuit components that are used to close the contacts 41 at the current zero-crossing. Accordingly, waveform 78 indicates the set pulse by the microcontroller 28 indicating operation of contacts 41.

Figure 7:
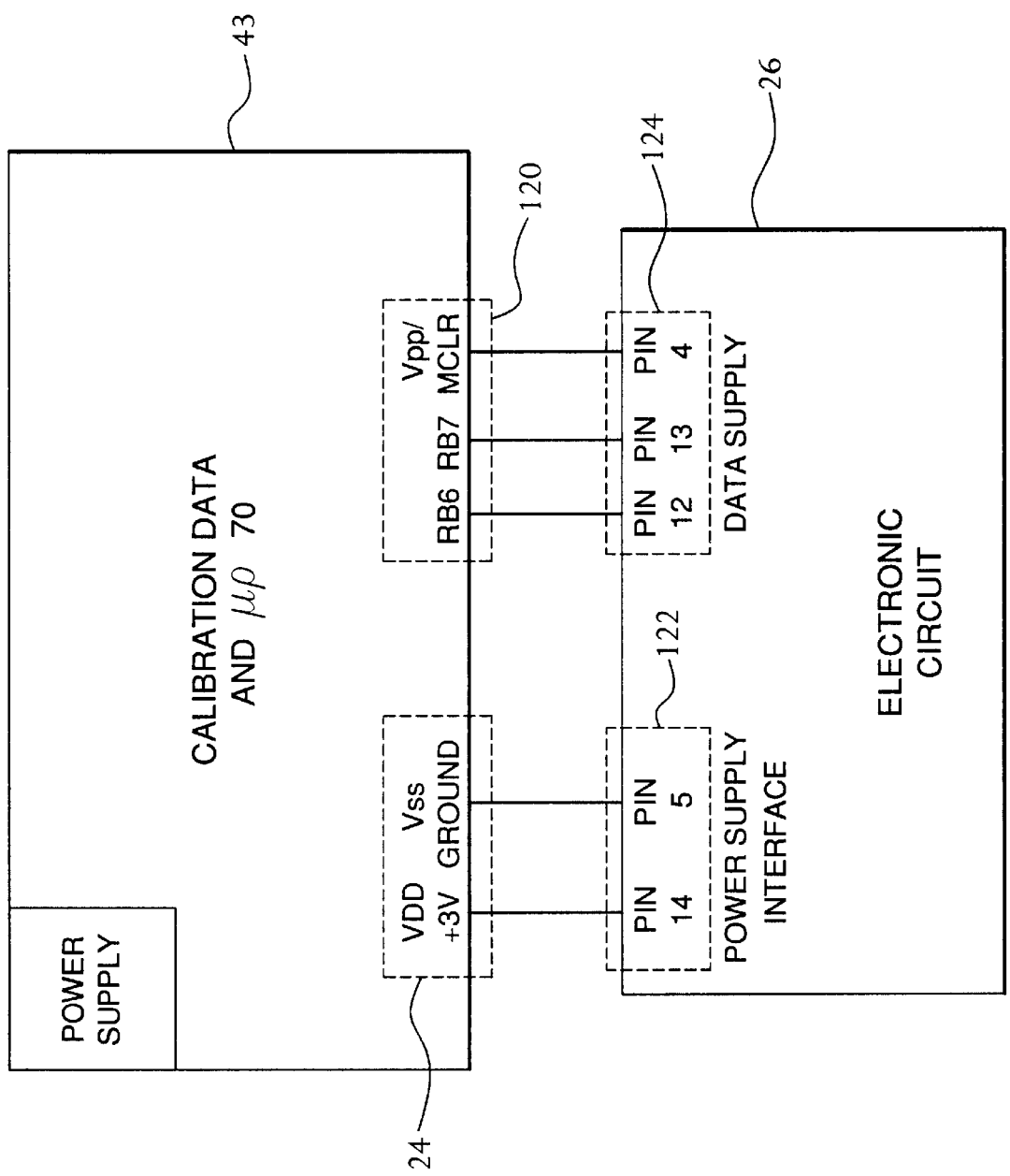
FIG. 7 is a block diagram illustrating the connections between a relay being calibrated and a calibration circuit constructed in accordance with an embodiment of the present invention.

FIG. 7 illustrates the process of transmitting the calibrated data 118 comprising the offset timing required for contact operation to be substantially coincident with the current zero-crossing. FIG. 7 is an expanded view of data transmission as first discussed in connection with FIG. 3, wherein the keyboard 46 is employed to provide calibration data 42 to the adaptive timing sensor 11. Furthermore, FIG. 7 depicts the physical connections between the electronic circuit 26 comprising the microcontroller 28 and the calibration data transmitter, for example, a keyboard 46 of FIG. 3.

The calibration block 43 represents the microprocessor 70 with calibration value 42. The microprocessor 70 preferably provides power to the electronic circuit 26 via power supply pins 24 comprising a ground connection and a hot line of +3 V. The data transfer preferably takes place between the pin connections located within boxes 120 and 124. Box 120 comprises two data buses RB6 and RB7, as well as a master clear connection to the pins (e.g., pins 12, 13, and 4, respectively) of microcontroller 28. The data is sent to microprocessor 28 and is written to the EEPROM therein for later use. The data comprises, for example, the time between pulses used to initiate contact operation, the actual pulse time, reaction time of the microprocessor 28, the relay set pulse timing, offset timing for ensuring the contact operation substantially coincident with current zero-crossing, and timing of completion of a cycle comprising setting and resetting the relay.

Although only several exemplary embodiments of the present invention have been described in detail above, those skilled in the art will readily appreciate that many modifications are possible in the exemplary embodiments without materially departing from the novel teachings and advantages of this invention. Accordingly, all such modifications are intended to be included within the scope of this invention as defined in the following claims.

What is claimed is:

1. A method for determining timing of contact operation of a relay, said method comprising the steps of:
generating a relay test request signal characterized by a plurality of pulses occurring in a pre-determined pattern;
operating said contact of said relay in response to one of said pulses;
determining the amount of time required for operation of said contacts of said relay in response to said pulse;
determining an adjustment factor selected from the group consisting of power supply variation and processing device variation, said power supply variation representing non-nominal power supply operation and said processing device variation representing time duration of software code execution to initiate operation of said relay; and
programming a processing device to employ said amount of time and said adjustment factor to calibrate operation of said relay.

2. A method as claimed in claim 1, wherein said processing device is a sensor, said relay being calibrated by said processing device in accordance with said amount of time to facilitate operation of a lighting device connected to said sensor at substantially the zero-crossing of a power supply for said lighting device.

3. A method as claimed in claim 1, wherein said amount of time is the effective time between pulses.

4. A method claimed in claim 1, wherein said processing device variation corresponds to time duration of software execution to use said amount of time to operate said relay at substantially the zero-crossing of an input power signal.

5. A method as claimed in claim 1, wherein said operating step is selected from the group consisting of opening said contacts and closing said contacts.

6. A method as claimed in claim 1, wherein said operating step comprises activating said relay at substantially a zero crossing of a power supply for a load with which said relay operates.

7. A method as claimed in claim 1, further comprising the steps of:
testing said relays;
determining relay activation times representing said amount of time for each of said relays;
storing said relay activation times in a memory device; and
storing said relay activation times in respective said processing devices with which corresponding said relays are employed.

8. A method as claimed in claim 7, further comprising the steps of:
repeating said testing step a selected amount of times;
averaging said relay activation times obtained for each of said relays;
storing said averaging step in said respective said processing devices.

9. A method as claimed in claim 7, wherein said determining step comprises the step of adjusting at least one of said relay activation times in accordance with said adjustment factor.

10. An apparatus for testing contact operation of a relay within a control device, said apparatus comprising:
a processing device;
a memory device coupled to said processing device; and
an interface circuit for coupling a control circuit to said processing device,
wherein said processing device is programmable to determine an amount of time for said relay to operate based on threshold variations of said processing device and power supply voltage variations.

11. An apparatus as claimed in claim 10, wherein said contact operation is selected from the group consisting of opening contacts on said relay and closing said contacts.

12. An apparatus as claimed in claim 10, wherein said processing device is programmable to determine activation of said relay at substantially a zero voltage level crossing of a power supply for a load with which said relay operates.

13. An apparatus as claimed in claim 12, wherein said power supply is a non-nominal power supply comprising one of higher than average voltage and lower than the average voltage with respect to an expected power supply, and said amount of time is adjusted to include an adjustment factor selected from the group consisting of power supply variation and processing device variation, said power supply variation representing non-nominal power supply operation and said processing device variation representing time duration of software code execution to initiate operation of said relay.

14. An apparatus as claimed in claim 10, wherein said relay is a semiconductor device.

15. An apparatus as claimed in claim 14, wherein said semiconductor device is an SCR or a triac.

16. An apparatus as claimed in claim 10, wherein said control device is a lighting device that employs a sensor selected from the group consisting of a sensor and an ambient light sensor.

17. A computer-readable medium of programming code stored thereon for testing contact operation of a relay, said computer readable medium comprising:
a first module for generating a relay test request signal characterized by a plurality of pulses occurring in a pre-determined pattern;
a second module for operating a contact on said relay in response to one of said pulses;
a third module for determining the amount of time required for operation of said contact of said relay in response to said pulse;
a fourth module for determining an adjustment factor selected from the group consisting of power supply variation and processing device variation, said power supply variation representing non-nominal power supply operation and said processing device variation representing time duration of software code execution to initiate operation of said relay;
a fifth module for programming a processing device to employ said amount of time and said adjustment factor to calibrate operation of said relay.

18. A computer-readable medium as claimed in claim 17, wherein said contact operation is selected from the group consisting of opening said contact and closing said contact.

19. A computer-readable medium as claimed in claim 17, wherein said relay is operable at substantially a zero-crossing of a power supply for a load with which said relay operates.

20. A computer-readable medium as claimed in claim 17, wherein said processing device is a sensor, said relay being calibrated by said processing device in accordance with said amount of time to facilitate operation of a lighting device connected to said sensor at substantially the zero-crossing of a power supply for said lighting device.

21. A method for deploying a plurality of relays in a respective control device, each of said control devices comprising a corresponding one of said relays and a processing device, said method comprising the steps of:

testing successive contacts of said relays and generating respective contact activation times;

storing said contact activation times corresponding to said relays in a memory device; and programming said contact activation times from said memory device to each of said corresponding said processing device.

22. A method as claimed in claim 21, wherein said contact activation times comprise opening times of said contacts and closing times of said contacts.

23. A method as claimed in claim 21, wherein said contact activation times occurs substantially simultaneously to a zero-crossing of a power supply for respective loads with which said relays operate.

24. A method as claimed in claim 21, wherein one of said control devices is a sensor, and said relay is calibrated by said processing device in accordance with an amount of time to facilitate operation of a lighting device connected to said sensor at substantially a zero-crossing of a power supply for said lighting device.

25. A method as claimed in claim 21, further comprising the step of adjusting said contact activation times to include an adjustment factor selected from the group consisting of power supply variation and processing device variation, said power supply variation representing non-nominal power supply operation and said processing device variation representing time duration of software code execution to initiate operation of said relay.

* * * * *